(12) United States Patent
Wilson

(10) Patent No.: US 7,670,958 B2
(45) Date of Patent: *Mar. 2, 2010

(54) ETCHING METHODS

(75) Inventor: Aaron R. Wilson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/497,702

(22) Filed: Aug. 1, 2006

(65) Prior Publication Data

US 2007/0034603 A1 Feb. 15, 2007

Related U.S. Application Data

(63) Continuation of application No. 10/427,296, filed on Apr. 30, 2003, now abandoned.

(51) Int. Cl.
H01L 21/302 (2006.01)
(52) U.S. Cl. ............... 438/711; 438/719; 438/724; 438/725
(58) Field of Classification Search .......... 438/711, 438/719, 724, 725
See application file for complete search history.

(56) References Cited

U.S. PATENT DOCUMENTS

| 4,786,359 A | 11/1988 | Stark et al. | |
|---|---|---|---|
| 5,384,009 A | 1/1995 | Mak et al. | |
| 5,503,901 A * | 4/1996 | Sakai et al. | 438/723 |
| 6,144,163 A | 11/2000 | Amemiya et al. | |
| 6,326,307 B1 | 12/2001 | Lindley et al. | |
| 6,475,920 B2 | 11/2002 | Coburn et al. | |
| 6,544,429 B1 * | 4/2003 | Hung et al. | 216/67 |
| 2001/0022216 A1 * | 9/2001 | Ye et al. | 156/345 |
| 2002/0155724 A1 * | 10/2002 | Sakai et al. | 438/710 |
| 2002/0155725 A1 * | 10/2002 | Stoehr et al. | 438/715 |
| 2003/0029835 A1 | 2/2003 | Yauw et al. | |
| 2003/0100190 A1 * | 5/2003 | Cote et al. | 438/710 |
| 2003/0232504 A1 * | 12/2003 | Eppler et al. | 438/709 |
| 2004/0155012 A1 | 8/2004 | Rusu et al. | |
| 2005/0014383 A1 * | 1/2005 | Ji et al. | 438/710 |

OTHER PUBLICATIONS

Wolf et al., "Silicon Processing for the VLSI Era", 1986, Lattice Press, vol. 1, pp. 348-349, 427-428, 576, 581.
Wolf, "Silicon Processing for the VLSI Era", 1986, Lattice Press, vol. 2, p. 84.

(Continued)

*Primary Examiner*—Binh X Tran
(74) *Attorney, Agent, or Firm*—Wells St. John P.S.

(57) ABSTRACT

An etching method includes applying a photoresist over a substrate, forming an opening in the photoresist, and etching the substrate under the opening using a plasma generated with a gas composition containing argon and an amount of higher atomic mass inert gas. The amount may be effective to increase photoresist stability compared to otherwise identical etching lacking any of the higher atomic mass inert gas. The photoresist may have a composition sensitized to an actinic energy wavelength of 248 nm or less. A method of increasing the stability of 248 nm or less photoresist during RIE includes providing a means for reducing electron temperature of a plasma and etching a substrate exposed through photoresist openings without substantially destabilizing the photoresist.

16 Claims, 7 Drawing Sheets

OTHER PUBLICATIONS

Wolf, "Silicon Processing for the VLSI Era", 2002, Lattice Press, vol. 4, p. 673.

Bartlett et al., "Calculation of Electron-Impact Total-Ionization Cross Sections", Jul. 17, 2002, The American Physical Society, vol. 66, Physical Review A, pp. 012707-1-012707-10.

Streetman, "Solid State Electronic Devices", 1990, Prentice Hall, 3$^{rd}$ ed., pp. 134-135.

K.H. Bai and H.Y. Chang, "Electron Temperature Analysis of Two-Gas-Species Inductively Coupled Plasma", Applied Physics Letters, American Institute of Physics, Sep. 10, 2001, vol. 79, No. 11, pp. 1596-1598.

Rossnagel et al., Handbook of Plasma Processing, 1990, Noyes Publications, p. 209.

* cited by examiner

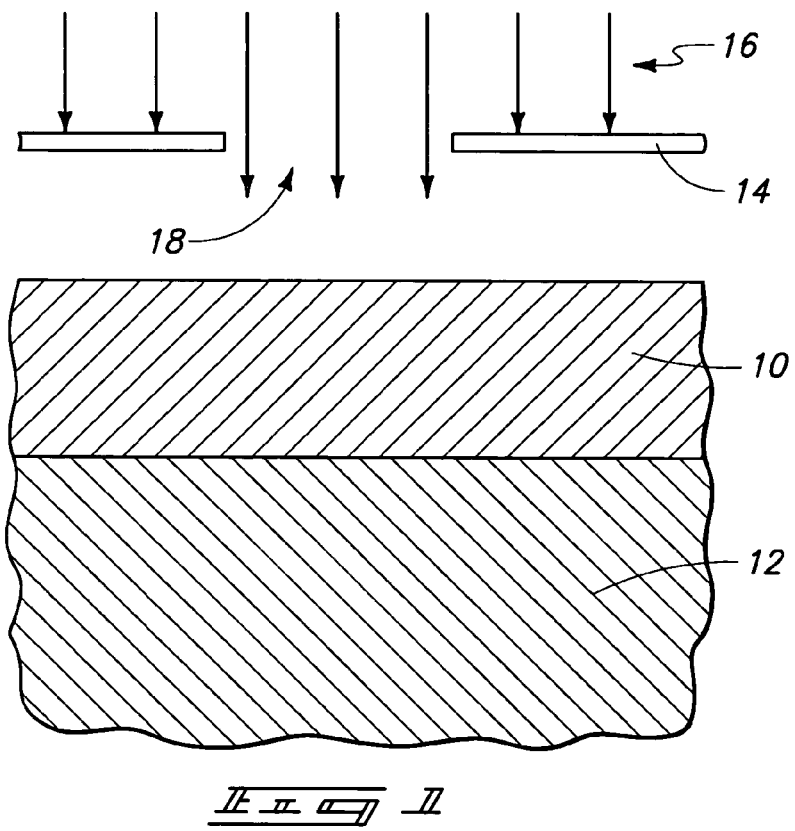
_Fig. 1_
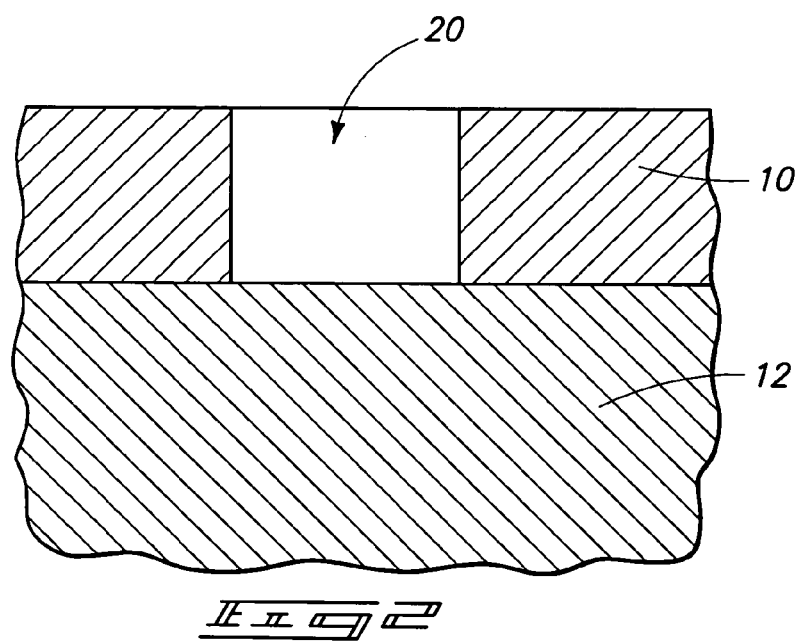
_Fig. 2_

ETCHING METHODS

RELATED PATENT DATA

This patent resulted from a continuation application of U.S. patent application Ser. No. 10/427,296, filed Apr. 30, 2003, now abandoned and which is incorporated herein by reference.

TECHNICAL FIELD

The invention pertains to etching methods, for example reactive ion etching (RIE) methods, and methods of increasing the stability of photoresist during RIE.

BACKGROUND OF THE INVENTION

Photoresists constitute one type of resist that is commonly used in integrated circuit fabrication to selectively process certain portions of a substrate exposed to processing conditions through openings in the photoresist. Other portions of the substrate protected by the photoresist are typically not processed. A wide variety of photoresists are available to choose from based on compatibility with substrate materials, processing conditions, desired feature size, etc. As smaller feature sizes become more desirable, photoresists capable of printing smaller feature sizes become increasingly advantageous. Generally, a shorter wavelength of actinic energy used to expose a photoresist allows smaller features sizes to be printed compared to a longer wavelength.

Unfortunately, incompatibilities may exist for selected photoresists. When such photoresists are used as an etch mask in RIE, the photoresist may not be stable. Deformities produced in the unstable photoresist during RIE may transfer to an underlying substrate, causing roughening and/or striating instead of yielding normally smooth surfaces.

Accordingly, it is desirable to identifying a way to stabilize the photoresist during RIE.

SUMMARY OF THE INVENTION

In one aspect of the invention, an etching method includes applying a photoresist over a substrate, forming an opening in the photoresist, and etching the substrate under the opening using a plasma generated with a gas composition containing argon and an amount of higher atomic mass inert gas. The amount may be effective to increase photoresist stability compared to otherwise identical etching lacking any of the higher atomic mass inert gas. The photoresist may have a composition sensitized to an actinic energy wavelength of 248 nm or less. By way of example, generating the plasma may include applying a total power density of at least 5 Watts/centimeter$^2$ (W/cm$^2$) to a bottom electrode. Generating the plasma may instead, or in addition, involve applying dual RF frequency, including a RF frequency of greater than 2 MHz to a bottom electrode. As one example, inert gases of the gas composition may consist of argon and xenon.

In another aspect of the invention, an etching method includes applying a photoresist over a substrate, forming an opening in the photoresist and etching the substrate under the opening using a plasma generated with a gas composition containing an amount of at least one of xenon and krypton. The amount is effective to increase photoresist stability compared to otherwise identical etching using argon or lower atomic mass noble gas in place of the at least one of xenon and krypton. The photoresist has a composition sensitized to an actinic energy wavelength of 248 nm or less. By way of example, the gas composition may further contain argon.

In a further aspect of the invention, a method of increasing the stability of 248 nm or less photoresist during RIE includes forming developed 248 nm or less photoresist on a substrate, providing a first inert gas composition in a RIE chamber, providing a reactive gas in the RIE chamber, and forming a plasma in the RIE chamber using at least the first composition and applying a power density of at least 5 W/cm$^2$. The photoresist has openings therethrough and the first inert gas composition consists of components having an atomic mass less than or equal to argon. The method includes providing a means for reducing electron temperature of the plasma and etching the substrate exposed through the openings using the plasma and the reactive gas without substantially destabilizing the photoresist.

BRIEF DESCRIPTION OF THE DRAWINGS

Preferred embodiments of the invention are described below with reference to the following accompanying drawings.

FIG. 1 is a partial sectional view of a substrate in process according to one aspect of the invention.

FIG. 2 is a partial sectional view of the FIG. 1 substrate at a subsequent process step.

DETAILED DESCRIPTION OF THE PREFERRED EMBODIMENTS

Figure 3:
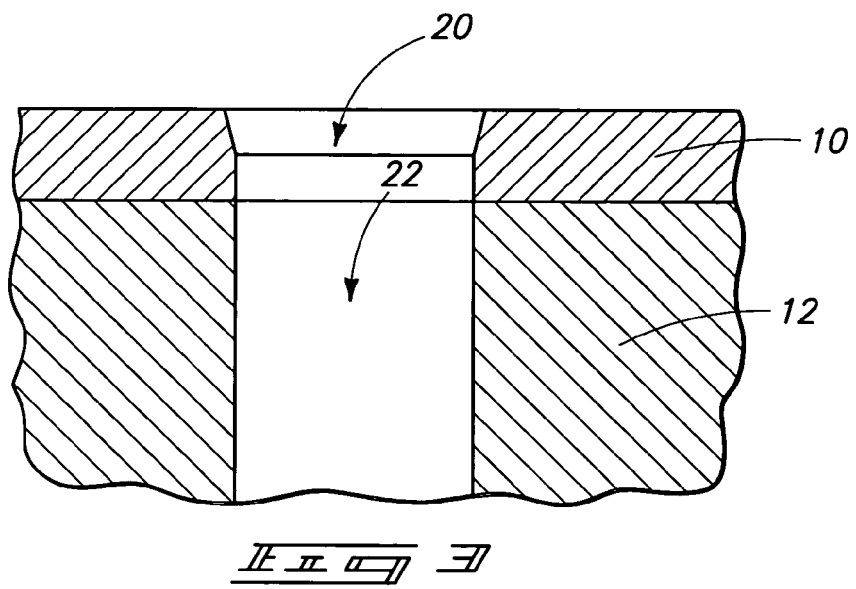
FIG. 3 is a partial sectional view of the FIG. 2 substrate at a subsequent process step.

FIG. 1 shows a substrate 12 with a photoresist 10 formed over substrate 12. Photoresist 10 and substrate 12 are shown at a process step that involves selective exposure of photoresist 10. The expose step involves positioning a mask 14 having a mask opening 18 proximate photoresist 10. As generally known in the art, mask 14 may include a plurality of openings having a variety of shapes to selectively expose portions of photoresist 10 through such openings. In FIG. 1, actinic energy 16 is applied such that mask 14 blocks some of actinic energy 16 and allows some of actinic energy 16 to pass through opening 18 exposing a selected portion of photoresist 10.

Next, as shown in FIG. 2, photoresist 10 may be developed by any suitable method known to those of ordinary skill, forming a resist opening 20. Resist opening 20 is shown formed through photoresist 10. Although it is typically desired to form resist openings completely through photoresist, it is conceivable that some resist openings might be formed in photoresist without extending completely through the photoresist. Baking of photoresist 10 or additional processing may be used in accordance with known photoresist processing methods to prepare photoresist 10 for later processing of substrate 12.

Substrate 12 may next be processed in any number of a variety of ways. For example, substrate 12 may be dry or wet etched, transferring a resist pattern defined by resist openings, such as resist opening 20, to substrate 12. Dry etching may include a variety of processes, such as reactive ion etching (RIE), that are of particular interest herein. FIG. 3 shows a substrate opening 22 formed in substrate 12. An upper portion of resist opening 20 in photoresist 10 is shown widened somewhat in FIG. 3. Depending on the type of etching, it is possible that some portion of a resist may also be etched back during etch processing of substrate 12 selective portions. However, if photoresist 10 is etched at a slower rate compared to substrate 12 and/or is of sufficient thickness, some partial etching of photoresist 10 may not degrade photoresist 10 sufficiently to prevent acceptable transfer of a resist pattern to an underlying substrate. As can be seen in FIG. 3, the resist pattern defined by resist opening 20 is adequately transferred as substrate opening 22 in substrate 12 despite the slight widening of an upper portion of resist opening 20 and the reduction to about one-half of the original thickness during etch.

Figure 4:
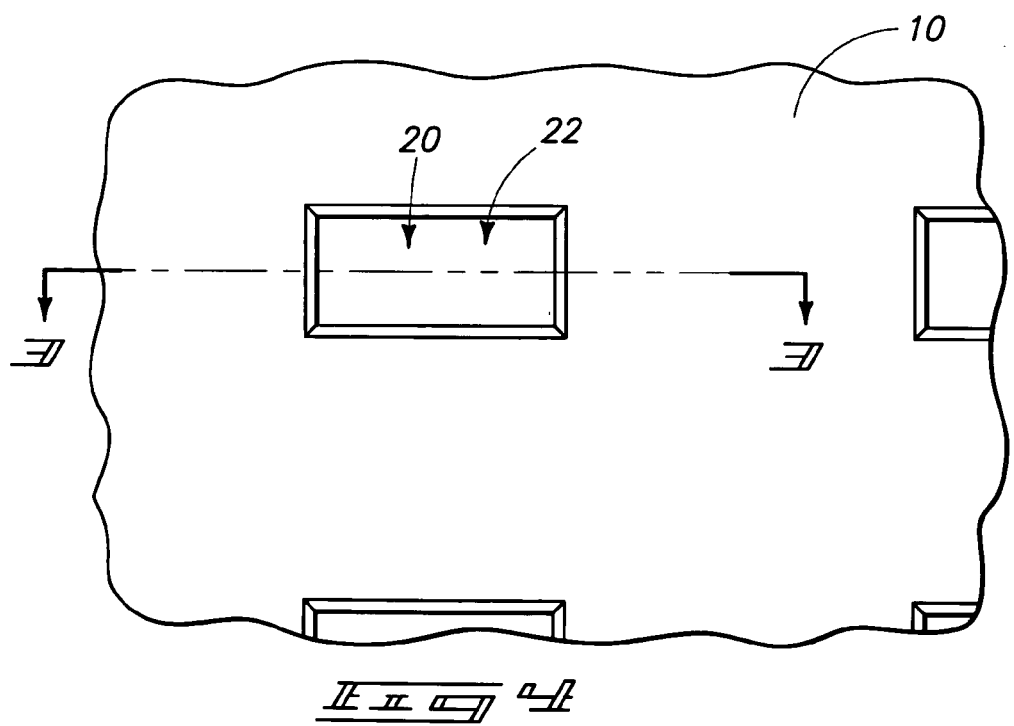
FIG. 4 is a partial top view of the FIG. 3 substrate and shows section 3-3 along which the FIG. 3 sectional view is taken.
Figure 5:
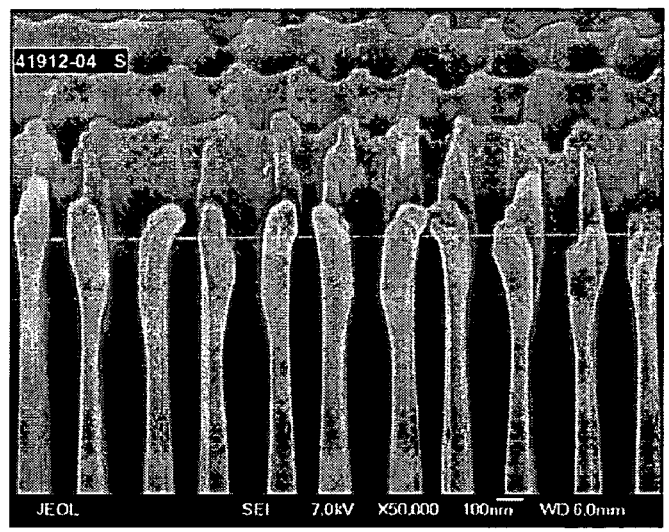
FIG. 5 is a photomicrograph perspective view of a first cross-section cut from a wafer and photoresist processed by RIE with argon as the only inert gas.
Figure 6:
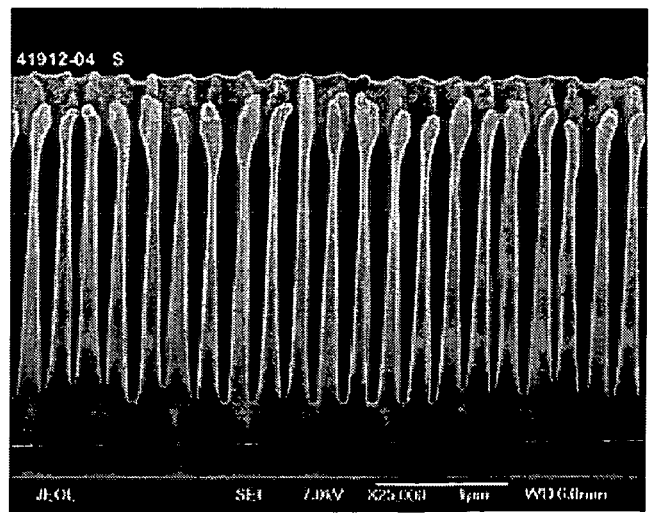
FIG. 6 is a side view of the FIG. 5 first cross-section.

Turning to FIG. 4, a partial top view is shown of the FIG. 3 substrate revealing section line 3-3 along which the FIG. 3 sectional view is taken. Additional openings are shown in FIG. 4 formed proximate resist opening 20 and substrate opening 22. As an example, substrate opening 22 and the other openings in FIG. 4 may reveal a conductive contact (not shown) through insulative material. The above described processing may thus often be termed as a contact etch. Even though the various aspects of the invention described herein are especially suitable to formation of integrated circuitry and general semiconductor processing, it should be appreciated that selective processing of a substrate using a photoresist followed by etching has application in a variety of other contexts.

In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described herein.

Observation has revealed that a photoresist may become unstable during etching, in particular dry etching and more particularly RIE. In the context of the present document, becoming unstable refers to producing deformities in the photoresist of such an extent that normally smooth surfaces in the processed substrate become roughened and/or striated. Accordingly, a stable photoresist is one that does not produce roughening and/or striation in the processed underlying substrate. FIGS. 5-8 show various views of a cross-section taken from a material processed by RIE. To produce the material shown in FIGS. 5-8, a 7800 Angstrom (Å) thick photoresist layer was spun onto a 2 micrometer (μm) thick borophosphosilicate glass (BPSG) layer. The photoresist was exposed to 248 nanometer (nm) light from a stepper through a mask, then developed according to the manufacturer's specifications to form a plurality of openings through the photoresist to the underlying substrate.

RIE was then performed in a Lam 2300 Excelan Oxide Etch Chamber using 270 standard cubic centimeters per minute (sccm) argon as the inert gas and a combination of 7 sccm $C_4F_6$ and 5 sccm $C_4F_8$ as the reactive gas. The Lam 2300 Excelan maintains its top electrode at ground while applying dual radio frequency (RF) energy to its bottom electrode at frequencies of 27 megahertz (MHz) and 2 MHz. The wafer was received by the bottom electrode. A plasma was generated in the etch tool at a temperature of 60 C for a duration of 300 sec while applying a total power density to the bottom electrode of 7.5 $W/cm^2$.

Figure 7:
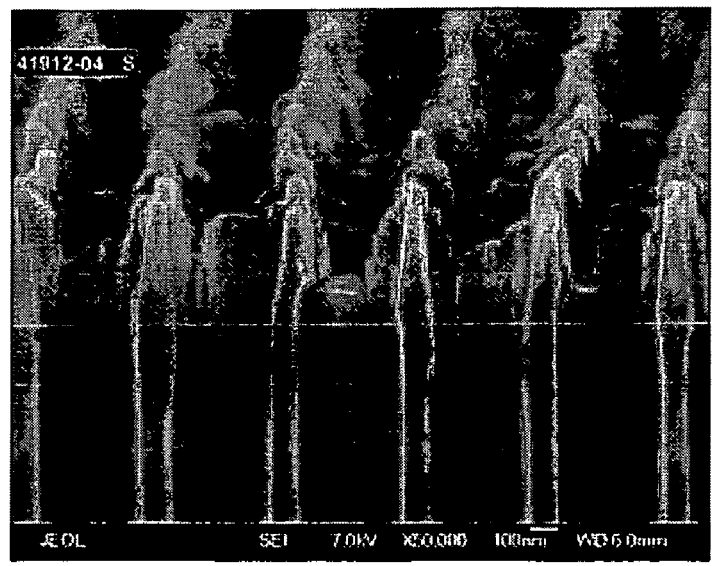
FIG. 7 is a photomicrograph perspective view of a second cross-section cut from the FIG. 5 wafer and photoresist at an angle 90° from the first cross-section shown in FIG. 5.
Figure 8:
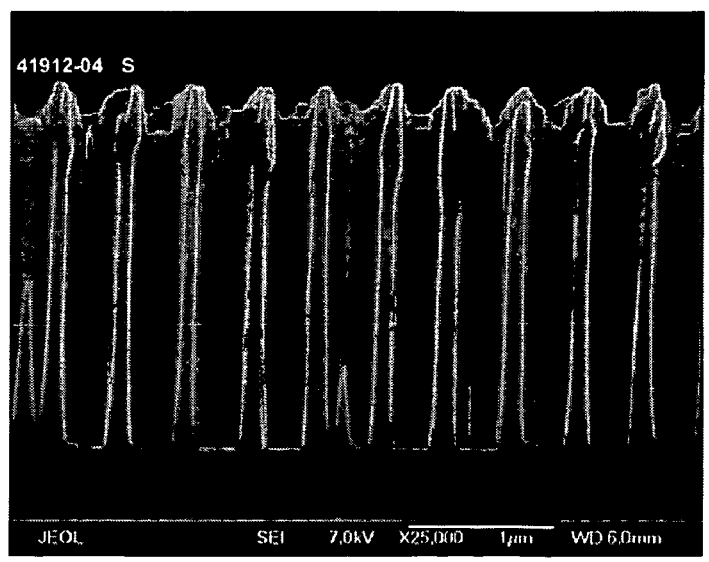
FIG. 8 is a side view of the FIG. 7 second cross-section.
Figure 9:
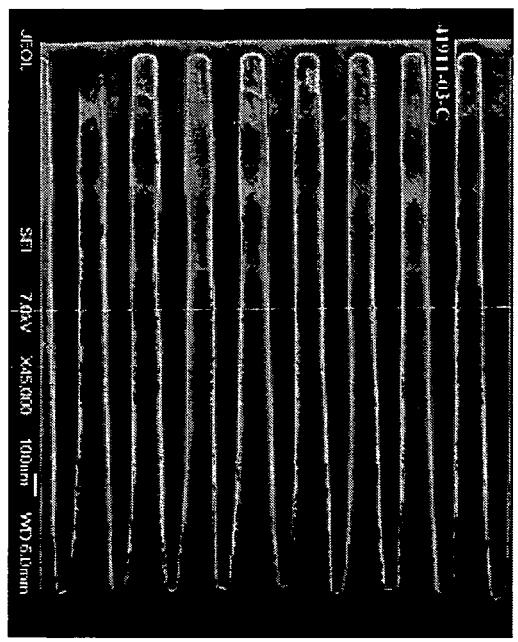
FIG. 9 is a photomicrograph side view of a first cross-section cut from a wafer and photoresist processed by RIE with equal volume parts argon and xenon as the inert gases.
Figure 10:
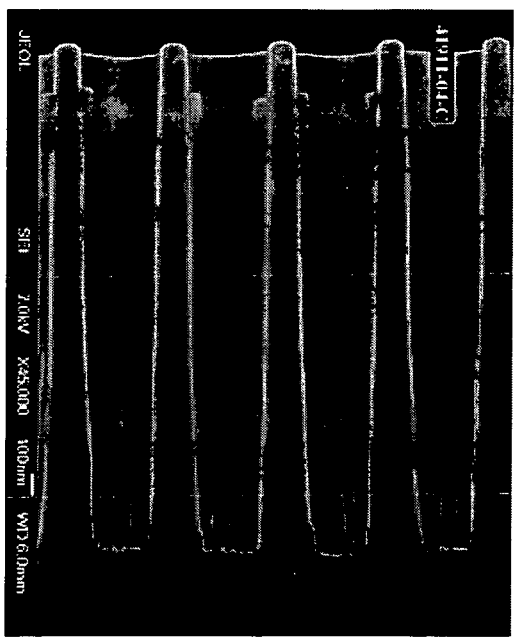
FIG. 10 is a photomicrograph side view of a second cross-section cut from the FIG. 9 wafer and photoresist at an angle 90° from the first cross-section shown in FIG. 9.
Figure 11:
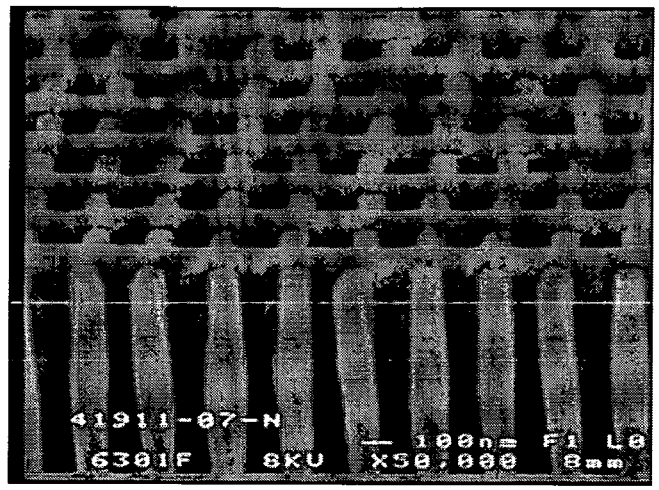
FIG. 11 is a photomicrograph perspective view of a first cross-section cut from a wafer and photoresist processed by RIE with argon and xenon as the inert gases.
Figure 12:
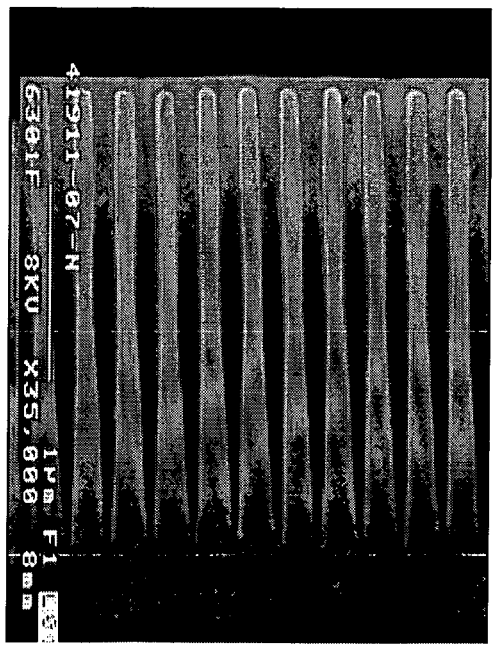
FIG. 12 is a side view of the FIG. 11 first cross-section.
Figure 13:
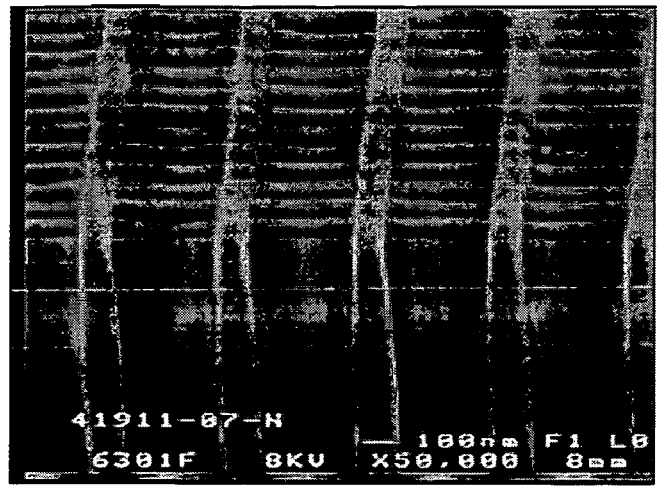
FIG. 13 is a photomicrograph perspective view of a second cross-section cut from the FIG. 11 wafer and photoresist at an angle 90° from the first cross-section shown in FIG. 11.
Figure 14:
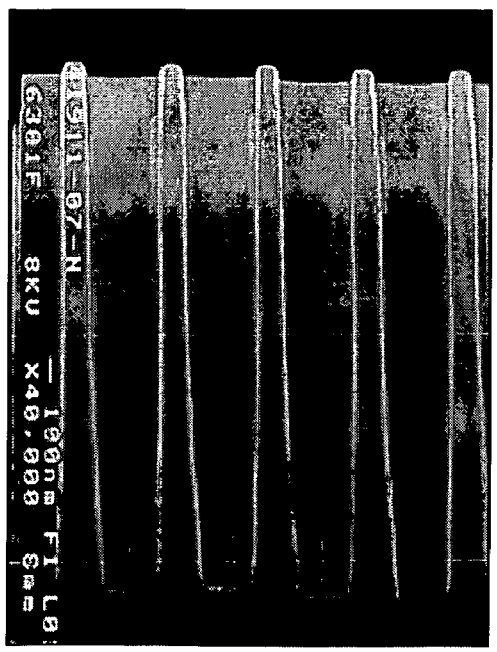
FIG. 14 is a side view of the FIG. 13 second cross-section.

The intention of the RIE was to form substrate openings such as shown in FIGS. 9-14. However, it is apparent from the features of FIG. 5 and the corresponding features of FIGS. 6-8 that the photoresist became unstable during RIE, deforming the openings and causing the substrate to become roughened and/or striated. The highest point of the structures in FIGS. 5-9 corresponds roughly to a top surface of developed photoresist that has a thickness of about 3900 Å (about one-half of the original 7800 Å thickness spun onto the BPSG layer). Accordingly, although a top surface of the substrate is not readily apparent, its location can be easily approximated in the figures. Striae in the substrate are seen in FIGS. 7 and 8 as defined by grooves or cracks in the upper portion of the openings formed in the substrate. As known to those of ordinary skill, such roughening and/or striating is not desirable in an etched substrate.

Additional investigation revealed that similar roughening and/or striating occurred for 248 nm or less photoresist etched by RIE in other etch tools under similar process conditions. Example photoresists include 248 nm, 193 nm, 157 nm, electron ultra violet (EUV), etc. Photoresist instability was observed in an Applied Materials (AMAT) Applied Producer Oxide Etch Chamber that applies RF energy to its top electrode at a frequency of 60 MHz and to its bottom electrode at a frequency of 13.5 MHz. Total power density applied to the bottom electrode was more than 5 $W/cm^2$. Interestingly, photoresist instability was not initially observed after RIE processing in a Tokyo Electron (TEL) SCCM Oxide Etch Chamber that uses a dual RF frequency of 60 MHz applied to its top electrode and 2 MHz applied to its bottom electrode. Upon still further investigation, photoresist instability was nevertheless observed after RIE processing in the TEL Etch Chamber when a total power density of 5 $W/cm^2$ or greater was applied to the bottom electrode.

Accordingly, it appeared that photoresist instability occurred in etch tools applying dual RF frequency with a RF frequency of greater than 2 MHz applied to a bottom electrode. Also, photoresist instability occurred when a total power density of 5 $W/cm^2$ or greater was applied to the bottom electrode. Each of the three described etch chambers are two-plate, capacitively coupled chambers having two RF generators driving at different frequencies. The wafer in each was received by the bottom electrode.

Those of ordinary skill in the art addressing the described instability problems may expect that the instability was due to excessive heat applied to the photoresist and may be motivated to reduce that heat by using a noble gas lighter than the argon used in the above described etches. A lighter noble gas inherently has a better capacity to remove heat from a photoresist. However, addition of helium, a noble gas having a lower atomic mass than argon, did not resolve the instability in the Lam and AMAT Etch Chambers. Also, supplementing the argon by adding helium produced instability of photoresist during RIE processing in the TEL Etch Chamber that previously did not incur instability.

Optical emission spectroscopy (OES) indicated that a high energy tail of electrons was formed in the electron energy distribution function (EEDF) with the addition of helium in the TEL RIE. Electron temperature was thus viewed as a significant factor in stabilizing the 248 nm or less photoresist found to be unstable during RIE using inert gases having an atomic mass less than or equal to argon. It was discovered that selecting other inert gases to supplement or replace some of the argon or lighter inert gases may be effective in lowering the electron temperature. An inert gas exhibiting one or more of the following properties may be used to lower electron temperature: a lower ionization potential (i.e., voltage), a larger ionization cross-section (i.e., probability), and a larger atomic mass.

Testing revealed that sufficiently lowering electron temperature stabilized 248 nm photoresists during RIE under the above described etch conditions in the Lam, AMAT, and TEL Etch Chambers. Specifically, replacing some of the argon with xenon was found effective. Xenon has a slightly lower ionization voltage, a larger ionization cross-section, and a greater atomic mass compared to argon, satisfying all three of the properties useful in lowering electron temperature. Another advantage of xenon is that it is a noble gas like argon and is not expected to interfere with plasma chemistry except for the change in electron temperature. Therefore, replacement of some argon with xenon produces only small changes, if any, in etch rate and in the etch profile resulting from a stable resist. Etch profile refers to the structure of the feature etched into the substrate. Of course, the various aspects of the invention described herein include replacing or supplementing an amount of argon or lighter inert gases with gases that may not be inert and/or may not be noble gases. Even so, excellent results were obtained with xenon and may be expected for the heavier noble gas krypton and perhaps even radon.

Results obtained for replacement with xenon are shown in FIGS. 9-14. To obtain the results shown in FIGS. 9 and 10, the processing conditions described above for the Lam 2300 were changed by replacing half of the argon with xenon. Accordingly, 135 sccm xenon and 135 sccm argon were used such that the total inert gases comprised about 50 volume percent (vol %) inert gas having a greater atomic mass than argon. The results shown in FIGS. 11-14 were similarly obtained by using 100 sccm xenon and 170 sccm argon such that the total inert gases comprised about 37 vol % inert gas having a greater atomic mass than argon.

Some belief may exist among those of ordinary skill that all noble gases are substitutable as inert, carrier, or bulk gases used in dry etching, especially RIE. However, the investigations described herein reveal that such gases are not substitutable at least for 248 nm or less photoresist processed by RIE, and perhaps for other photoresist and/or types of etching. For example, resist instability was also observed during analogous investigations with non-developable resists such as AR-2455 available from Shipley Company, L.L.C. in Marlborough, Mass. and B200 available from JSR Corporation in Tokyo, Japan.

As noted above, when some argon was replaced with helium in the TEL Etch Chamber using process conditions that did not otherwise produce instability, the replacement with helium caused roughening and/or striation of 248 nm photoresist. Such occurrence indicates that argon and helium are not substitutable. Additionally, FIGS. 9-14 show that a mixture of xenon and argon maintains 248 nm photoresist stability during RIE. However, replacement of the xenon with argon, such that all inert gas constitutes argon, causes instability. Further, many etch tools, including the Lam, AMAT, and TEL Etch Chambers referenced herein, are designed to use only one inert gas, such as argon. Altering the inert gas may create processing problems such as occurred with replacement of some argon with helium in the TEL Etch Chamber. Viewed collectively, the described findings clearly indicate that no reasonable expectation exists that xenon and/or krypton are necessarily substitutable for argon. Even so, described herein are various aspects of the invention wherein process gas compositions, such as inert or carrier gas compositions, may be altered to resolve resist instability problems without introducing other significant problems.

According to one aspect of the invention, an etching method includes applying a photoresist over a substrate, forming an opening in the photoresist, and etching the substrate under the opening using a plasma generated with a gas composition containing argon and an amount of higher atomic mass inert gas. The amount may be effective to increase photoresist stability compared to otherwise identical etching lacking any of the higher atomic mass inert gas. The photoresist may have a composition sensitized to an actinic energy wavelength of 248 nm or less.

By way of example, forming the photoresist opening may include exposing a selective portion of the photoresist to actinic energy having a wavelength of 248 nm or less, developing the photoresist, and forming the opening through the photoresist. Generating the plasma may include applying a total power density of at least 5 W/cm$^2$ to a bottom electrode. Generating the plasma may instead, or in addition, involve applying dual RF frequency, including a RF frequency of greater than 2 MHz to a bottom electrode. Either way, the bottom electrode may receive the substrate. The higher atomic mass inert gas may contain at least one of xenon, krypton, and radon. As one example, inert gases of the gas composition may consist of argon and xenon. The amount of higher atomic mass inert gas may comprise from about 30 to 99 vol % of inert gases, with 50 vol % identified as performing well.

According to another aspect of the invention, an etching method includes applying a photoresist over a substrate, forming an opening in the photoresist and etching the substrate under the opening using a plasma generated with a gas composition containing an amount of at least one of xenon and krypton. The amount is effective to increase photoresist stability compared to otherwise identical etching using argon or lower atomic mass noble gas in place of the at least one of xenon and krypton. The photoresist has a composition sensitized to an actinic energy wavelength of 248 nm or less. By way of example, an inert gas portion of the gas composition may comprise from about 30 to 100 vol % of the at least one of xenon and krypton. Also, the gas composition may further contain argon. Even though 100 vol % xenon and/or krypton as the inert gas might not be compatible with some etch tools (possibly those designed for argon use only) it is conceivable that certain etch tools may nevertheless tolerate 100 vol % of the described inert gases quite well.

In a further aspect of the invention, a RIE method includes applying a photoresist over a substrate, exposing a selected portion of the photoresist to actinic energy having a wavelength of 248 nm or less, developing the photoresist and forming a plurality of openings through the photoresist, and etching the substrate under the plurality of openings. The etching uses a plasma generated from a gas composition containing argon and an amount of at least one of xenon and krypton. The amount is effective to increase photoresist stability compared to otherwise identical etching lacking xenon and krypton. The photoresist has a composition sensitized to an actinic energy wavelength of 248 nm or less.

According to a still further aspect of the invention, a method of increasing the stability of 248 nm or less photoresist during RIE includes forming developed 248 nm or less photoresist on a substrate, providing a first inert gas composition in a RIE chamber, providing a reactive gas in the RIE chamber, and forming a plasma in the RIE chamber using at least the first composition and applying a power density of at least 5 W/cm$^2$. The photoresist has openings therethrough and the first inert gas composition consists of components having an atomic mass less than or equal to argon. The method includes providing a means for reducing electron temperature of the plasma and etching the substrate exposed through the openings using the plasma and the reactive gas without substantially destabilizing the photoresist. A substantially destabilized photoresist is one that will produce unacceptable roughening and/or striation of the underlying substrate. Possibly, a small amount of destabilization may occur in a photoresist without effectively roughening or striating the underlying substrate.

As one example, the means for reducing electron temperature can include providing a second inert gas composition in the RIE chamber and forming the plasma using at least the first and second compositions. The second composition includes components have an atomic mass greater than argon. Accordingly, the first composition may consist of argon and the second composition may consist of at least one of krypton and xenon. Also, the first and second compositions may be mixed before entering the RIE chamber. Alternatively, the first and second compositions may enter the RIE chamber through separate ports of the chamber and not mix until after entering the chamber. The reactive gas may contain at least one gas selected from the group including halogenated hydrocarbons and halocarbons. Examples of halogenated hydrocarbons include fluorinated hydrocarbons ($CH_xF_y$), especially $CHF_3$, $CH_2F_2$, etc. Examples of halocarbons include ($C_xF_y$), especially $CF_4$, $C_2F_6$, $C_4F_8$, $C_4F_6$, etc.

As an additional example, instead of or in addition to the second gas composition having an atomic mass greater than argon, the second gas composition may have an ionization cross-section greater than argon. Similarly, instead of or in addition to having an atomic mass greater than argon, the second gas composition may have an ionization voltage less than argon.

In addition to the advantages of the various aspects of the invention described herein, a related advantage is that photoresist capable of printing small features, but for the instability incurred during dry etching, may be used more effectively. Further, current or later developed dry etch tools, such as plasma etch tools, generating high electron temperatures can be coupled with the described means for reducing electron temperature and used with resists, including photoresists, that might otherwise destabilize during etching.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. An etching method providing an etch tool exhibiting a design based on a design specification designating use of argon only as an inert gas, wherein the improvement comprises:
    applying a photoresist over a substrate, the photoresist having a composition sensitized to an actinic energy wavelength of 248 nm or less;
    forming an opening in the photoresist;
    placing the substrate in the etch tool; and
    etching the substrate under the opening using a plasma generated with a gas composition comprising argon and an amount of krypton while applying a total power density of at least 5 W/cm$^2$ to a bottom electrode receiving the substrate, the amount being effective to increase photoresist stability compared to otherwise identical etching using argon or lower atomic mass noble gas in place of the krypton and the increase in photoresist stability decreases production of deformities in the photoresist of such an extent that smooth surfaces of the substrate before the etching would become roughened and/or striated during the etching and which deformities do not result merely from photoresist faceting.

2. The method of claim 1 wherein the forming an opening comprises:
    exposing a selected portion of the photoresist to actinic energy having a wavelength of 248 nm or less;
    developing the photoresist; and
    forming the opening through the photoresist.

3. The method of claim 1 wherein the etching further uses a reactive gas comprising one or more gas selected from the group consisting of halogenated hydrocarbons and halocarbons.

4. The method of claim 1 wherein generating the plasma comprises applying dual RF frequency, including a RF frequency of greater than 2 MHz to a bottom electrode, the bottom electrode receiving the substrate.

5. The method of claim 1 wherein the amount comprises from about 30 to about 50 vol % of an inert gas portion of the gas composition.

6. The method of claim 1 wherein the gas composition is effective to decrease substrate roughness compared to otherwise identical etching lacking krypton.

7. The method of claim 1 wherein the substrate comprises an electrical contact and the gas composition is effective to decrease contact striation compared to otherwise identical etching lacking krypton.

8. A method providing an RIE etch tool exhibiting a design based on a design specification designating use of a first inert gas composition only as an inert gas, wherein the improvement comprises:
    forming developed 248 nm or less photoresist on a bulk semiconductive wafer, the photoresist having openings therethrough;
    providing the first inert gas composition in a RIE chamber, the first composition consisting of components having an atomic mass less than or equal to argon and the RIE etch tool containing the RIE chamber;
    providing a reactive gas in the RIE chamber;
    forming a plasma in the RIE chamber using at least the first composition and applying power density of at least 5 W/cm$^2$;
    providing a means for reducing electron temperature of the plasma; and etching the substrate exposed through the openings using the plasma and the reactive gas without substantially destabilizing the photoresist, which includes decreasing production of deformities in the photoresist of such an extent that smooth surfaces of the substrate before the etching would become roughened and/or striated during the etching and which deformities do not result merely from photoresist faceting.

9. The method of claim 8 wherein the reactive gas comprises one or more gas selected from the group consisting of halogenated hydrocarbons and halocarbons.

10. The method of claim 8 wherein forming the plasma comprises applying dual RF frequency, including a RF frequency of greater than 2 MHz to a bottom electrode, the bottom electrode receiving the substrate.

11. The method of claim 8 wherein the means for reducing electron temperature comprises providing a second inert gas composition in the RIE chamber and forming the plasma using at least the first and second compositions, the second composition comprising krypton.

12. The method of claim 11 wherein the first composition consists of argon and the second composition consists of krypton.

13. The method of claim 11 wherein the first and second compositions are mixed before entering the RIE chamber.

14. The method of claim 11 wherein a total of any inert gases comprises from about 30 to about 50 vol % second composition.

15. The method of claim 11 wherein the substrate comprises an electrical contact and the second composition is effective to decrease contact roughening and striation compared to otherwise identical etching lacking the second composition.

16. A reactive ion etching method providing an RIE etch tool exhibiting a design based on a design specification designating use of argon only as an inert gas, wherein the improvement comprises:

applying a photoresist over a substrate, the photoresist having a composition sensitized to an actinic energy wavelength of 248 nm or less;

exposing a selected portion of the photoresist to actinic energy having a wavelength of 248 nm or less;

developing the photoresist and forming a plurality of openings through the photoresist;

placing the substrate in a capacitively-coupled RIE chamber having a bottom electrode that receives the substrate, a top electrode, and two RF generators, the RIE etch tool containing the RIE chamber; and etching the substrate under the plurality of openings using a plasma generated from a gas composition comprising argon and an amount of krypton by applying a total power density of at least 5 $W/cm^2$ to the bottom electrode and applying dual RF frequency, including a RF frequency of greater than 2 MHz to the bottom electrode which is different from the frequency applied to the top electrode, the amount of krypton being effective to increase photoresist stability compared to otherwise identical etching lacking krypton and the increase in photoresist stability decreases production of deformities in the photoresist of such an extent that smooth surfaces of the substrate before the etching would become roughened and/or striated during the etching and which deformities do not result merely from photoresist faceting.

\* \* \* \* \*